United States Patent
He et al.

(10) Patent No.: US 8,570,087 B2
(45) Date of Patent: Oct. 29, 2013

(54) CIRCUITRY FOR CLOCK AND METHOD FOR PROVIDING CLOCK SIGNAL

(75) Inventors: Shiming He, Shanghai (CN); Liqian Chen, Shanghai (CN); Cong Yao, Shanghai (CN); Xiang Li, Shanghai (CN); Yu Liu, Shanghai (CN); Jiayin Lu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 57 days.

(21) Appl. No.: 13/311,069

(22) Filed: Dec. 5, 2011

(65) Prior Publication Data

US 2012/0139596 A1 Jun. 7, 2012

(30) Foreign Application Priority Data

Dec. 3, 2010 (CN) .......................... 2010 1 0573314

(51) Int. Cl.
 *H03K 3/00* (2006.01)
(52) U.S. Cl.
 USPC ......................................... 327/291; 327/161
(58) Field of Classification Search
 None
 See application file for complete search history.

(56) References Cited

U.S. PATENT DOCUMENTS

| 5,416,434 | A | * | 5/1995 | Kootstra et al. ............... 327/113 |
| 6,900,676 | B1 | | 5/2005 | Tamura |
| 7,973,576 | B2 | | 7/2011 | Chiu |
| 2004/0119521 | A1 | * | 6/2004 | Kurd et al. .................... 327/291 |
| 2006/0200699 | A1 | | 9/2006 | Flautner et al. |
| 2007/0064839 | A1 | * | 3/2007 | Luu ............................... 375/340 |

FOREIGN PATENT DOCUMENTS

| CN | 1794587 A | 6/2006 |
| CN | 101588165 A | 11/2009 |

OTHER PUBLICATIONS

First Chinese Office Action mailed May 3, 2012, issued in related Chinese Application No. 201010573314.2, Huawei Technologies Co., Ltd. (22 pages).
Partial translation of Rejection Decision dated Dec. 5, 2012 in connection with Chinese Patent Application No. 201010573314.2.
Dan Ernst et al., Razor: A Low-Power Pipeline Based on Circuit-Level Timing Speculation, IEEE Computer Society, 2003, 12 pages.
Dan Ernst et al. Razor: Dynamic Voltage Scaling Based on Circuit-Level Timing Speculation, Advanced Computer Architecture Laboratory The University of Michigan, Dec. 3, 2012, 36 pages.

* cited by examiner

*Primary Examiner* — Cassandra Cox

(57) ABSTRACT

The present invention provide a clock circuit and a method for providing a clock signal. The clock circuit includes: an adaptive clock generation circuit, configured to output an adaptive clock signal; and an adaptive clock driven circuit, configured to be driven by the adaptive clock signal to work. A maximum workable frequency of the adaptive clock driven circuit is higher than or equal to a frequency of the adaptive clock signal. When a working condition of the adaptive clock driven circuit is changed, the maximum workable frequency of the adaptive clock driven circuit is changed, the frequency of the adaptive clock signal which is output by the adaptive clock generation circuit is changed, and a changing direction of the frequency of an adaptive clock signal is consistent with that of the maximum workable frequency. The clock circuit and method may be used in design or manufacturing of a digital circuit.

16 Claims, 6 Drawing Sheets

CIRCUITRY FOR CLOCK AND METHOD FOR PROVIDING CLOCK SIGNAL

CROSS-REFERENCE TO RELATED APPLICATIONS

This application claims priority to Chinese Patent Application No. 201010573314.2, filed on Dec. 3, 2010, which is hereby incorporated by reference in its entirety.

FIELD OF THE INVENTION

The present invention relates to the field of circuit technologies, and in particular, to a clock circuit and a method for providing a clock signal.

BACKGROUND OF THE INVENTION

Generally speaking, a maximum workable frequency Fmax that can be reached by a digital integrated circuit is related to a circuit physical property P (which is influenced by factors such as a manufacturing process and aging), a working voltage V and a working temperature T, that is, Fmax=f(P, V, T).

With continual decreasing of a line width of the digital integrated circuit, on one hand, the randomness of a chip manufacturing process is increased, where circuits of a same design, after being manufactured, have circuit physical properties P that are distributed wider; on the other hand, Fmax of a same physical circuit is more sensitive to a change in parameters such as the voltage V and the temperature T. The above two aspects both causes that the maximum workable frequency Fmax of the digital integrated circuit is distributed in a wider range.

Currently, a clock source used by the digital integrated circuit, that is, a clock generation circuit, whether it is a crystalloid, an oscillator or a TCXO (Temperature Compensate X'tal (crystal) Oscillator, temperature compensate x'tal (crystal) oscillator) which is mounted outside a chip of the circuit, or it is a PLL (Phase Lock Loop, phase lock loop), a DLL (Delay locked loop, delay locked loop), or a frequency divider circuit which is inside a chip, aims at a stable frequency, that is, does best to keep a frequency of an output clock signal unchanged under different parameter distribution conditions of the circuit physical property, the working temperature, and the working voltage.

However, under a circumstance that parameter conditions of the circuit physical property, the working temperature, and the working voltage are dispersed, if the digital integrated circuit is required to work in a constant frequency, it is a must to set a working frequency of the digital integrated circuit to be a frequency at which the digital integrated circuit is capable of working under most unfavorable parameters so as to ensure the circuit to work stably. For example, the working frequency of the digital integrated circuit is set to be a working frequency under a maximum working temperature, a minimum working voltage or a poorest circuit physical property (such as a poorest producing process). The maximum workable frequency of the digital integrated circuit under typical parameters is far higher than the working frequency under most unfavorable parameters, and therefore the working manner restrains the potential of the digital integrated circuit from being fulfilled, limits performance of the digital integrated circuit, and may cause an increase in power consumption of the digital integrated circuit.

SUMMARY OF THE INVENTION

Embodiments of the present invention provide a clock circuit and a method for providing a clock signal, which are capable of effectively optimizing circuit performance.

In order to achieve the objective, the following technical solutions are adopted in the embodiments of the present invention.

A clock circuit includes:

an adaptive clock generation circuit, configured to output an adaptive clock signal; and an adaptive clock driven circuit, configured to be driven by the adaptive clock signal to work, where a maximum workable frequency of the adaptive clock driven circuit is higher than or equal to a frequency of the adaptive clock signal, where when a working condition of the adaptive clock driven circuit is changed, the maximum workable frequency of the adaptive clock driven circuit is changed, the frequency of the adaptive clock signal which is output by the adaptive clock generation circuit is changed, and a changing direction of the frequency of the adaptive clock signal is consistent with a changing direction of the maximum workable frequency.

A method for providing a clock signal includes:

outputting, by an adaptive clock generation circuit, an adaptive clock signal so as to make the adaptive clock driven circuit be driven by the adaptive clock signal to work, where a maximum workable frequency of the adaptive clock driven circuit is higher than or equal to a frequency of the adaptive clock signal;

where when a working condition of the adaptive clock driven circuit is changed, the maximum workable frequency of the adaptive clock driven circuit is changed, the frequency of the adaptive clock signal which is output by the adaptive clock generation circuit is changed, and a changing direction of the frequency of the adaptive clock signal is consistent with a changing direction of the maximum workable frequency.

In the clock circuit and the method for providing a clock signal according to the embodiments of the present invention, a clock signal which has a frequency that is adaptively changed with an alteration of a working condition of the circuit is provided for an adaptive clock driven circuit. That is to say, the adaptive clock driven circuit can be made to work at a frequency which is equal to or close to a maximum workable frequency of the circuit at any time. Therefore, potential of the adaptive clock driven circuit can be fully fulfilled, and a processing speed of the adaptive clock driven circuit is obviously increased, so that performance of the adaptive clock driven circuit is effectively optimized.

BRIEF DESCRIPTION OF THE DRAWINGS

To illustrate the technical solutions in the embodiments of the present invention or in the prior art more clearly, accompanying drawings to be used for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The technical solutions of the present invention will be clearly and completely described in the following with reference to the accompanying drawings. It is obvious that the embodiments to be described are only a part rather than all of the embodiments of the present invention. All other embodiments obtained by persons of ordinary skill in the art based on the embodiments of the present invention without creative efforts shall fall within the protection scope of the present invention.

Figure 1:
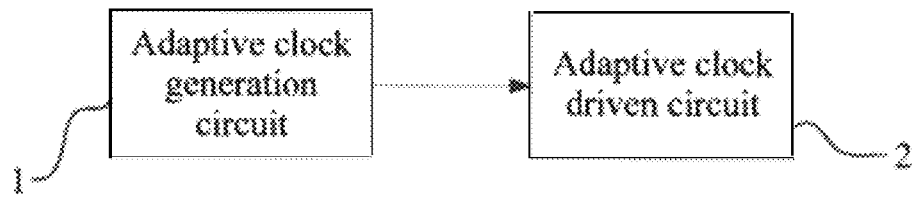
FIG. 1 is a schematic diagram of a logical structure of a clock circuit according to an embodiment of the present invention.

Referring to FIG. 1, an embodiment of the present invention provides a clock circuit, where the clock circuit is a digital circuit, which includes:

an adaptive clock generation circuit 1, configured to output an adaptive clock signal; and an adaptive clock driven circuit 2, configured to be driven by the adaptive clock signal to work, where a maximum workable frequency of the adaptive clock driven circuit 2 is higher than or equal to a frequency of the adaptive clock signal.

When a working condition of the adaptive clock driven circuit 2 is changed, the maximum workable frequency of the adaptive clock driven circuit 2 is changed, the frequency of the adaptive clock signal which is output by the adaptive clock generation circuit 1 is changed, and a changing direction of the frequency of the adaptive clock signal is consistent with a changing direction of the maximum workable frequency, that is, synchronously increasing or synchronously decreasing, so as to ensure working reliability of the adaptive clock driven circuit 2.

The clock circuit according to the embodiment of the present invention is capable of providing the adaptive clock driven circuit 2 with a clock signal which has a frequency that is adaptively changed with an alteration of a working condition of the circuit, that is, is capable of making the adaptive clock driven circuit 2 work at a frequency which is close to the maximum workable frequency of the circuit at any time. Therefore, potential of the adaptive clock driven circuit 2 is fully fulfilled, and a processing speed of the adaptive clock driven circuit 2 is obviously increased, so that performance of the adaptive clock driven circuit 2 is effectively optimized.

Specifically, the working condition of the adaptive clock driven circuit 2 includes a circuit physical property, a working voltage, and a working temperature of the adaptive clock driven circuit 2 during working. The change of the working condition of the adaptive clock driven circuit 2 includes a change of at least one of the circuit physical property, the working voltage and the working temperature of the adaptive clock driven circuit 2. When at least one of the above three is altered, the maximum workable frequency of the adaptive clock driven circuit 2 is accordingly altered, and the frequency of the adaptive clock signal which is output by the adaptive clock generation circuit 1 is also accordingly altered.

The frequency of the adaptive clock signal which is output by the adaptive clock generation circuit 1 is changed along with the change of the working condition of the adaptive clock driven circuit 2, so that in the clock circuit in the embodiment, the circuit physical property, the working voltage and the working temperature of the adaptive clock generation circuit 1 are the same as or close to those of the adaptive clock driven circuit 2. Specifically, in the clock circuit, a physical location of the adaptive clock generation circuit 1 and that of the adaptive clock driven circuit 2 are close to each other, and belong to the same voltage domain so as to ensure that the two have the same or close working temperatures and the same working voltage. In addition, preferably, the adaptive clock generation circuit 1 and the adaptive clock driven circuit 2 are formed by basic units which belong to a same basic unit library. In this way, the circuit physical properties of the two are ensured to be the same or close, and at the same time, the performance of the two, for example, delay performance, and the sensitiveness of the two to an alteration of a working condition is made similar, so that the performance of the adaptive clock driven circuit 2 is further optimized.

It should be noted that the basic unit library is a basic module of design of a large scale digital integrated circuit and is a basic logic functional circuit for implementing digital design such as an inverter, an AND logic, an OR logic and a register. At the same time the basic unit library abstracts a corresponding parameter from influence of a manufacturing process to facilitate the design and the physical implementation of the large scale digital integrated circuit. In the same manufacturing process, various basic unit libraries which are provided by different suppliers may exist, and different basic unit libraries may have large differences in delay influence which is caused by an alteration of a working condition.

It should be noted that, in the clock circuit according to the embodiment of the present invention, the changing of the frequency of an adaptive clock signal which is output by the adaptive clock generation circuit 1 along with alteration of the circuit physical property, the working voltage and/or the working temperature is essentially decided by a physical property of the adaptive clock generation circuit 1. The above alteration of the working condition causes a transmission speed of a signal in the adaptive clock generation circuit 1 to be changed. For example, when aging occurs in the adaptive clock generation circuit, that is, a circuit physical property is changed, the transmission speed of the signal in the circuit is changed, and then the frequency of the adaptive clock signal which is output by the adaptive clock generation circuit 1 is changed.

It should be noted that, in order to make the adaptive clock driven circuit 2 work stably and normally, the adaptive clock generation circuit 1 may satisfy that: under each allowed working condition of the adaptive clock driven circuit 2, that is, a specific working voltage, working temperature and circuit physical property, the frequency of the clock signal which is output by the adaptive clock generation circuit 1 is always smaller than the maximum workable frequency of the adaptive clock driven circuit; and when a working condition of the adaptive clock driven circuit 2 is changed, a variation of the frequency of the adaptive clock signal which is output by the adaptive clock generation circuit 1 is close to a variation of the maximum workable frequency of the adaptive clock driven circuit 2.

In order to make the adaptive clock generation circuit 1 satisfy the above conditions, when the clock circuit according to the embodiment of the present invention is being designed or configured, specifically, the following rules may be followed to perform the design and the configuration, where the rules include:

The working condition of the adaptive clock generation circuit 1 and that of the adaptive clock driven circuit 2 are required to be as close to each other as possible, and specifically, the physical locations of the two may be made to be close to each other, and belong to a same voltage domain.

Furthermore, a working cycle of the output clock signal of the adaptive clock generation circuit 1, under all working conditions of the adaptive clock driven circuit 2, is required to be larger than a length of a critical path of the driven circuit, and be as close as possible to the length of the critical path after a margin is reserved. Here and in the embodiments of the present invention, the length of the critical path refers to a minimum working cycle which is capable of being borne under all working conditions. A length of a critical path of an adaptive clock driven circuit may be obtained by using methods such as STA and SPICE simulation.

Furthermore, a difference (a margin) between the working cycle of the output clock signal of the adaptive clock generation circuit 1 and the length of the critical path of the adaptive clock driven circuit 2 is required to be larger than a sum of the following parts, which include:

a maximum difference between the working cycle of the clock signal which is output by the adaptive clock generation circuit 1 under different working conditions of the adaptive clock driven circuit 2 and the length of the critical path;

a difference between the working cycle of the clock signal which is output by the adaptive clock generation circuit 1 and the length of the critical path before a change in the frequency of the clock signal is caused by a working condition and the adaptive clock driven circuit 2 receives the change in the frequency of the clock signal; and a difference, which is caused by an intrinsic property of a chip and a working condition difference, between the length of the critical path and the working cycle of the clock signal which is output by the adaptive clock generation circuit 1.

In order to enable persons skilled in the art to have a better understanding of the technical solutions in the embodiments of the present invention, the clock circuit in the embodiment of the present invention is further described in detail through a specific embodiment in the following.

Figure 2:
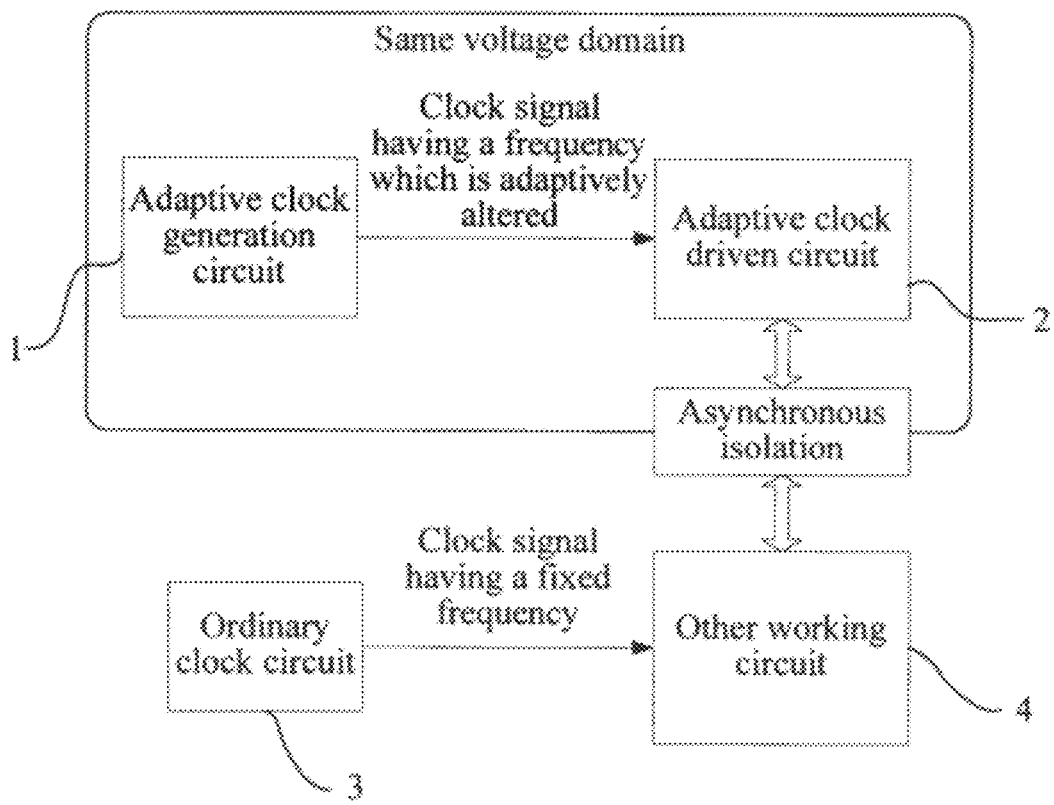
FIG. 2 is a schematic diagram of another logical structure of a clock circuit according to an embodiment of the present invention.

Referring to FIG. 2, a clock circuit of an embodiment of the present invention is a circuit system, which integrates multiple functions and includes an adaptive clock generation circuit 1 and an adaptive clock driven circuit 2, and further includes an ordinary clock circuit 3 and other working circuit 4.

The adaptive clock generation circuit 1 provides an adaptive clock signal for the adaptive clock driven circuit 2, where a frequency of the adaptive clock signal is lower than a maximum workable frequency of the adaptive clock driven circuit 2. When a working condition of the adaptive clock driven circuit 2 is changed, the maximum workable frequency of the adaptive clock driven circuit 2 changes, and a transmission speed of a signal in the adaptive clock generation circuit 1 is changed, so that the frequency of the adaptive clock signal which is output by the adaptive clock generation circuit is changed. In addition, a changing direction of the frequency of the adaptive clock signal is consistent with that of the maximum workable frequency.

The ordinary clock circuit 3 provides a clock signal having a fixed frequency to the other working circuit 4.

In a specific circuit, the adaptive clock generation circuit 1 and the adaptive clock driven circuit 2 are located at a synchronous circuit island; and the ordinary clock circuit 3 and the other working circuit 4 are locate at another synchronous circuit island, where each synchronous circuit island merely belongs to one voltage domain. In addition, the synchronous circuit island in which the adaptive clock generation circuit 1 and the adaptive clock driven circuit 2 are located and the synchronous circuit island in which the ordinary clock circuit 3 and the other working circuit 4 are asynchronously isolated from each other.

It should be noted that, in a digital circuit, circuits which are driven by a same clock belong to a same clock domain, If the digital circuit uses multiple clocks which do not have a phase relationship with each other to drive multiple different sub-modules, asynchronous processing, that is, asynchronous isolation, is required to be performed on interactive interfaces of these sub-modules, to ensure correct inter-clock-domain transmission of a signal. After being asynchronously isolated, a part of the circuit which is driven by a same clock (that is, a same clock domain) is called a synchronous circuit island. If the whole circuit is driven by a same clock, the whole circuit may be regarded as a synchronous circuit island without being asynchronously isolated.

It can be understood that FIG. 1 is merely a schematic diagram of a logical structure according to the embodiment, and an actual clock circuit may include multiple synchronous circuit islands which are asynchronously isolated from each other.

In the embodiment, a physical location of the adaptive clock generation circuit 1 and that of the adaptive clock driven circuit 2 are close to each other and belong to the same voltage domain, that is, working temperatures of the two are the same or close, and working voltages of the two are the same. In this way, when the working temperature and/or the working voltage of the adaptive clock driven circuit 2 is altered, the alteration of the working temperature and/or the working voltage of the adaptive clock generation circuit 1 is close to or the same as that of the adaptive clock driven circuit 2, so that the adaptive clock generation circuit 1 is capable of precisely sensing an alteration of the working condition of the adaptive clock driven circuit 2.

Figure 3:
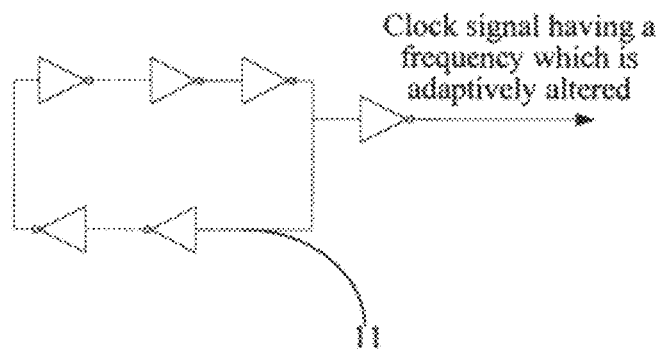
FIG. 3 is a schematic circuit diagram of an adaptive clock generation circuit of a clock circuit according to an embodiment of the present invention.

In this embodiment, the adaptive clock generation circuit 1 is a ring resonator circuit and uses self-excited oscillation to output the clock signal. The number of levels of the ring resonator may be determined according to the length of the critical path of the adaptive clock driven circuit 2, so as to ensure that the adaptive clock signal which is output by the adaptive clock generation circuit 1 enables the adaptive clock driven circuit 2 to work normally. And preferably, a basic unit which forms the ring resonator and a basic unit which forms the adaptive clock driven circuit 2 belong to a same basic unit library, that is, if the adaptive clock driven circuit 2 is formed by a logic gate, the ring resonator circuit is a logic-gate ring resonator circuit of the same unit library, so as to make physical properties of the two be the same as or close, at the same time, make performance of the two, for example, delay performance, and sensitiveness of the two to an alteration of a working condition be similar. As the working condition of the adaptive clock driven circuit 2 is altered, driven circuit proportions of delay changes of the adaptive clock generation circuit 1 and the adaptive clock driven circuit 2 is close and the difference between the frequency of the clock signal which is output by the adaptive clock generation circuit 1 and the maximum workable frequency of the adaptive clock driven circuit 2 under a current working condition is relatively small, which further optimizes the performance of the adaptive clock driven circuit 2. Specifically, referring to FIG. 3, the adaptive clock generation circuit 1 is an inverter ring resonator circuit which includes an inverter ring resonator 11.

Figure 4:
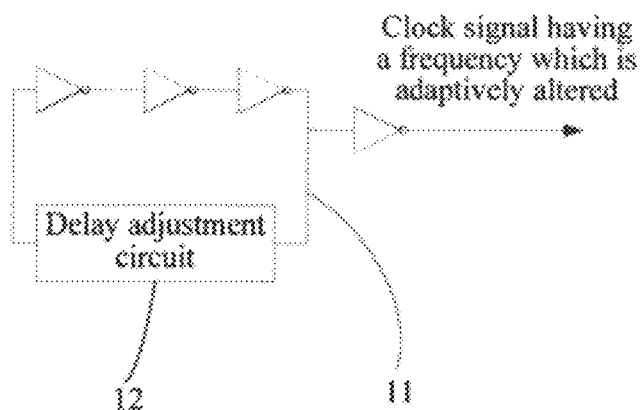
FIG. 4 is another schematic circuit diagram of an adaptive clock generation circuit of a clock circuit according to an embodiment of the present invention.

As an improvement of the embodiment, as shown in FIG. 4, a ring resonator circuit of the adaptive clock generation circuit 1 further includes a delay adjustment circuit 12, where an adaptive clock signal of the adaptive clock generation circuit 1, after being delayed by the delay adjustment circuit 12, is output to the adaptive clock driven circuit. The reason is that, a difference between the length of the critical path of the adaptive clock driven circuit 2, where the length is obtained at the preliminary design phase of a clock circuit, and that after a layout is implemented may exist. However, the delay adjustment circuit 12 is capable of, after the layout is implemented and even after a circuit is manufactured, adjusting a working frequency point of the adaptive clock generation circuit 1, so as to further match, under each working condition, the output frequency of the adaptive clock generation circuit 1 and the maximum workable frequency of the adaptive clock driven circuit 2. With the same reason as that of the ring resonator circuit, preferably, a basic unit which forms the delay adjustment circuit 12 and a basic unit which forms the adaptive clock driven circuit belong to a same basic unit library.

Figure 5:
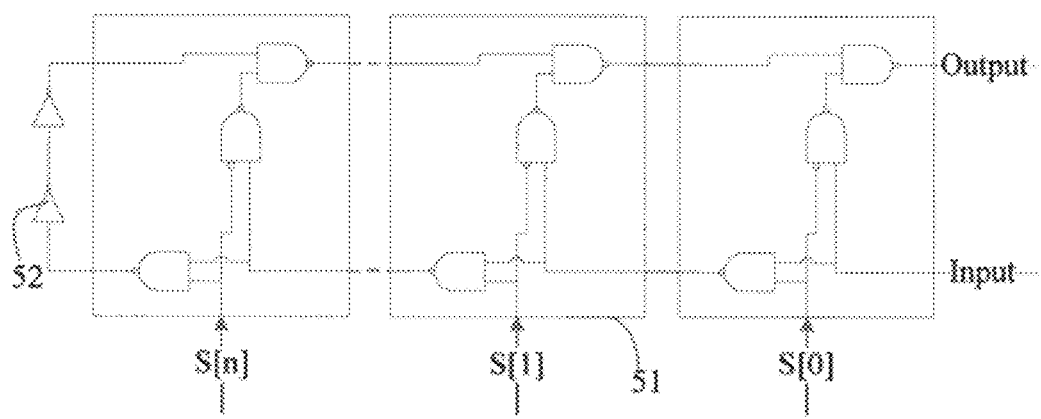
FIG. 5 is a schematic circuit diagram of a delay adjustment circuit of a clock circuit according to an embodiment of the present invention.

For example, the delay adjustment circuit 12 is formed by cascading n levels of delay units, where n is an integer which is lager than 0; and the delay adjustment circuit 12 obtains, through controlling the number of the levels of the delay units which are passed by a clock signal, different delay durations. Specifically, in an embodiment of the present invention, the delay adjustment circuit 12, as shown in FIG. 5, may be formed by parallel connecting n (n is larger than or equal to 1) levels of logic-gate circuits 51 and two serially connected NOT gates 52, where each logic-gate circuit has control ends S[0] to S[n], an input end and an output end disposed. The delay adjustment circuit may adjust, by configuring an input of the control end, the number of levels of logic-gate units which are passed by an adjustment signal to obtain different delay durations. For example, when the control ends S[0] to S[n] are all 1, the delay adjustment circuit 5 has a maximum delay being a delay of approximately 2n NAND gates plus two NOT gates; when S[0] to S[n] are all 0, the delay adjustment circuit 5 has a minimum delay being a delay of approximately two NAND gates. A delay of other configuration of the control ends is between the maximum and the minimum delay.

Figure 6:
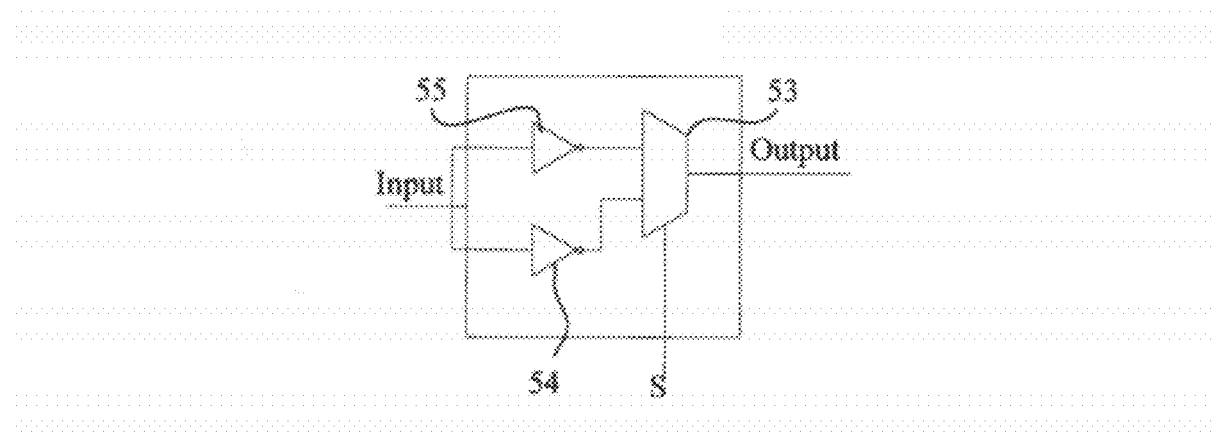
FIG. 6 is another schematic circuit diagram of a delay adjustment circuit of a clock circuit according to an embodiment of the present invention.

In another embodiment of the present invention, the delay adjustment circuit 12 may be shown in FIG. 6. The circuit includes a multiplexing selector 53, where the multiplexing selector 53 includes a control end and two input ends. The two input ends of the multiplexing selector 53 are respectively connected to two gate units 54 and 55 which have different delays. A control end S is set on the multiplexing selector 53. An input of the control end S of the multiplexing selector 53 may be configured, and the gate units with different delays may be selected for the clock signal to pass, so as to adjust a delay duration of the signal from being input to being output. The circuit has a relatively small adjustment step and is capable of acquiring, by alternating the different gate units 54 and 55, different delay differences. In addition, at least two delay adjustment circuits shown in FIG. 6 connected serially may be used as a delay adjustment circuit having different delays.

Definitely, it can be understood that, in still another embodiment of the present invention, a delay adjustment circuit 12 is formed by serially connecting at least one delay adjustment circuit shown in FIG. 5 and a delay adjustment circuit shown in FIG. 6.

Figure 7:
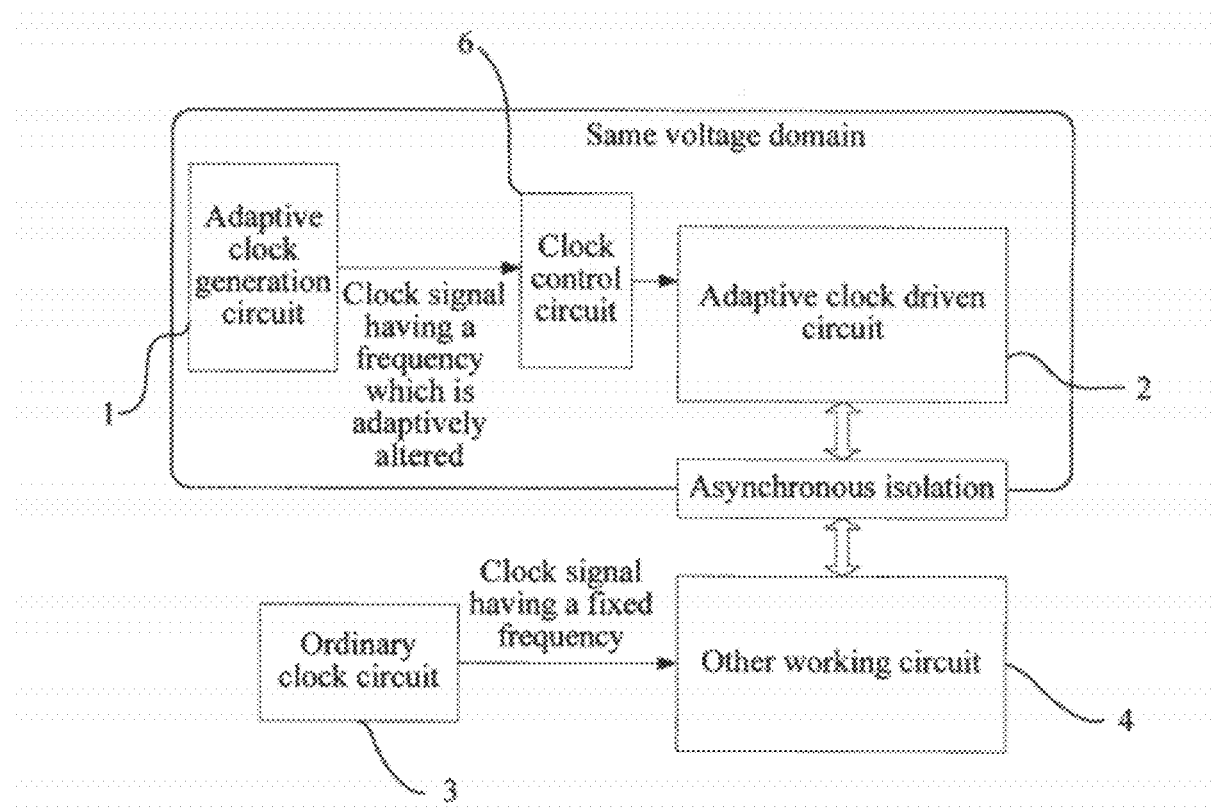
FIG. 7 is a schematic diagram of another logical structure of a clock circuit according to an embodiment of the present invention.

When manually or automatically, a working voltage of an adaptive clock driven circuit is altered rapidly and dramatically once, a frequency change of the output clock signal of the adaptive clock generation circuit 1 and a frequency change of the clock signal which is sensed by the adaptive clock driven circuit 2 are asynchronous, which thereby affects stability and reliability of the clock circuit in the embodiment of the present invention. Therefore, as an improvement of the embodiment, as shown in FIG. 7, the clock circuit according to the embodiment further includes a clock control circuit 6, which is capable of effectively solving the above problem and effectively ensuring the reliability of the clock circuit.

Figure 8:
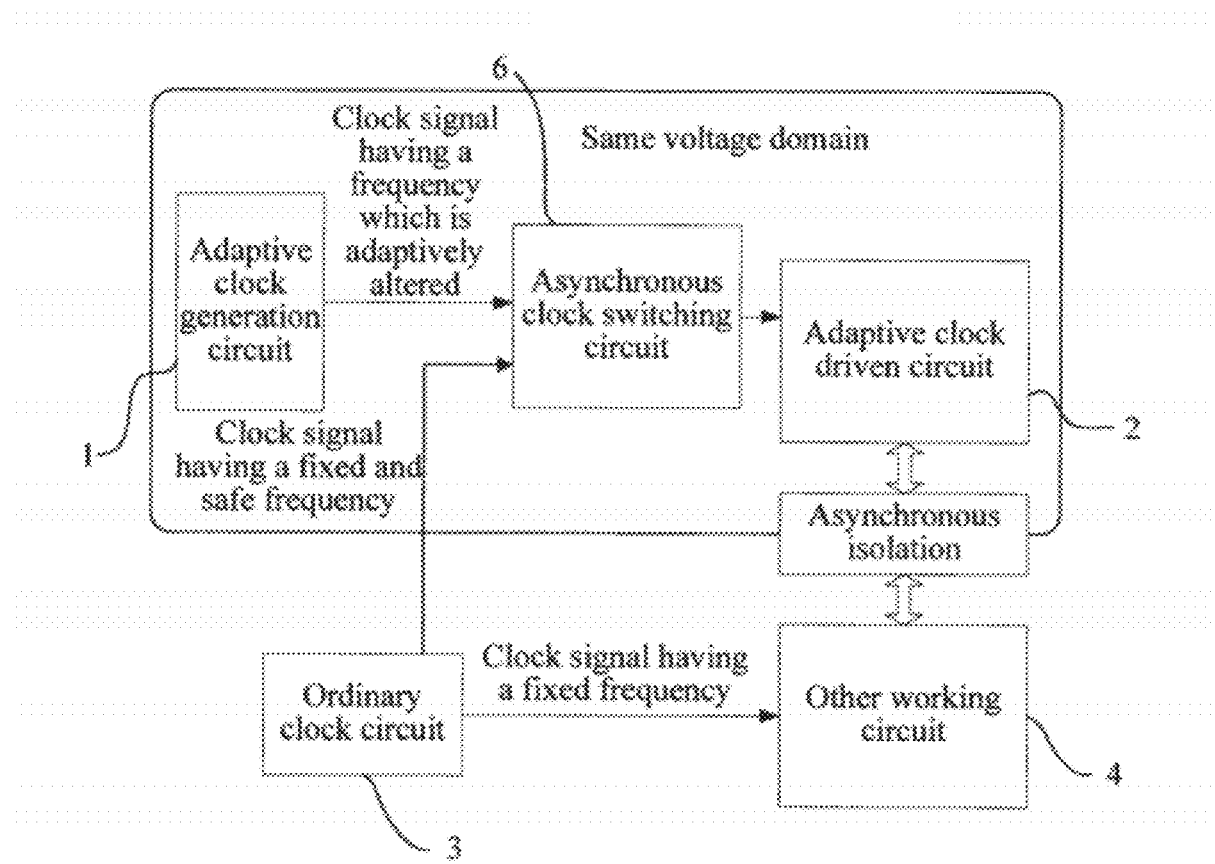
FIG. 8 is a schematic diagram of a logical structure of the clock circuit shown in FIG. 7.

Specifically, as shown in FIG. 8, the clock control circuit 6 is an asynchronous clock switching circuit, with input ends respectively connected to the adaptive clock generation circuit 1 and an ordinary clock generation circuit 3, and with an output end connected to the adaptive clock driven circuit 2, and is configured to: before the working voltage of the adaptive clock driven circuit 2 is altered, switch a clock signal of the adaptive clock driven circuit to a clock signal which has a fixed and safe frequency and is provided by the ordinary clock generation circuit 3; and after the working voltage of the adaptive clock driven circuit is altered and stabilized, switch the clock signal of the adaptive clock driven circuit 2 to the clock signal which is provided by the adaptive clock generation circuit 1. The asynchronous clock switching circuit may be a common asynchronous clock switching circuit in the prior art, which is not limited in the embodiment. A safe working frequency is defined as a fixed clock frequency under which the adaptive clock driven circuit 2 can work normally under any working condition.

Figure 9:
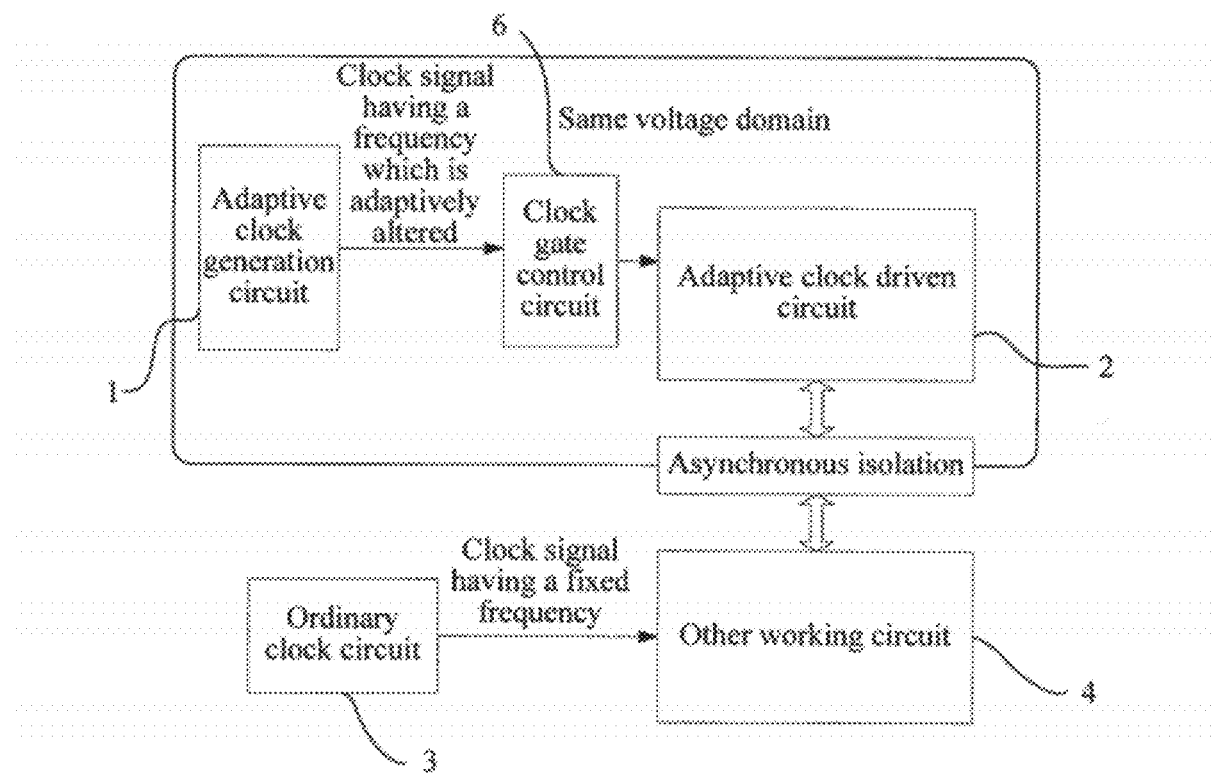
FIG. 9 is a schematic diagram of another logical structure of the clock circuit shown in FIG. 7.

Specifically, as shown in FIG. 9, the clock control circuit 6 is a clock gate control circuit with an input end connected to the adaptive clock generation circuit 1 and with an output end connected to the adaptive clock driven circuit 2, and is configured to: before the working voltage of the adaptive clock driven circuit 2 is altered, halt the clock signal of the adaptive clock driven circuit 2; and after the working voltage of the adaptive clock driven circuit 2 is altered and stabilized, switch the signal of the adaptive clock driven circuit 2 to the clock signal which is provided by the adaptive clock generation circuit 1. The clock gate control circuit may be a common clock gate control circuit in the prior art, which is not limited in the embodiment.

Figure 10:
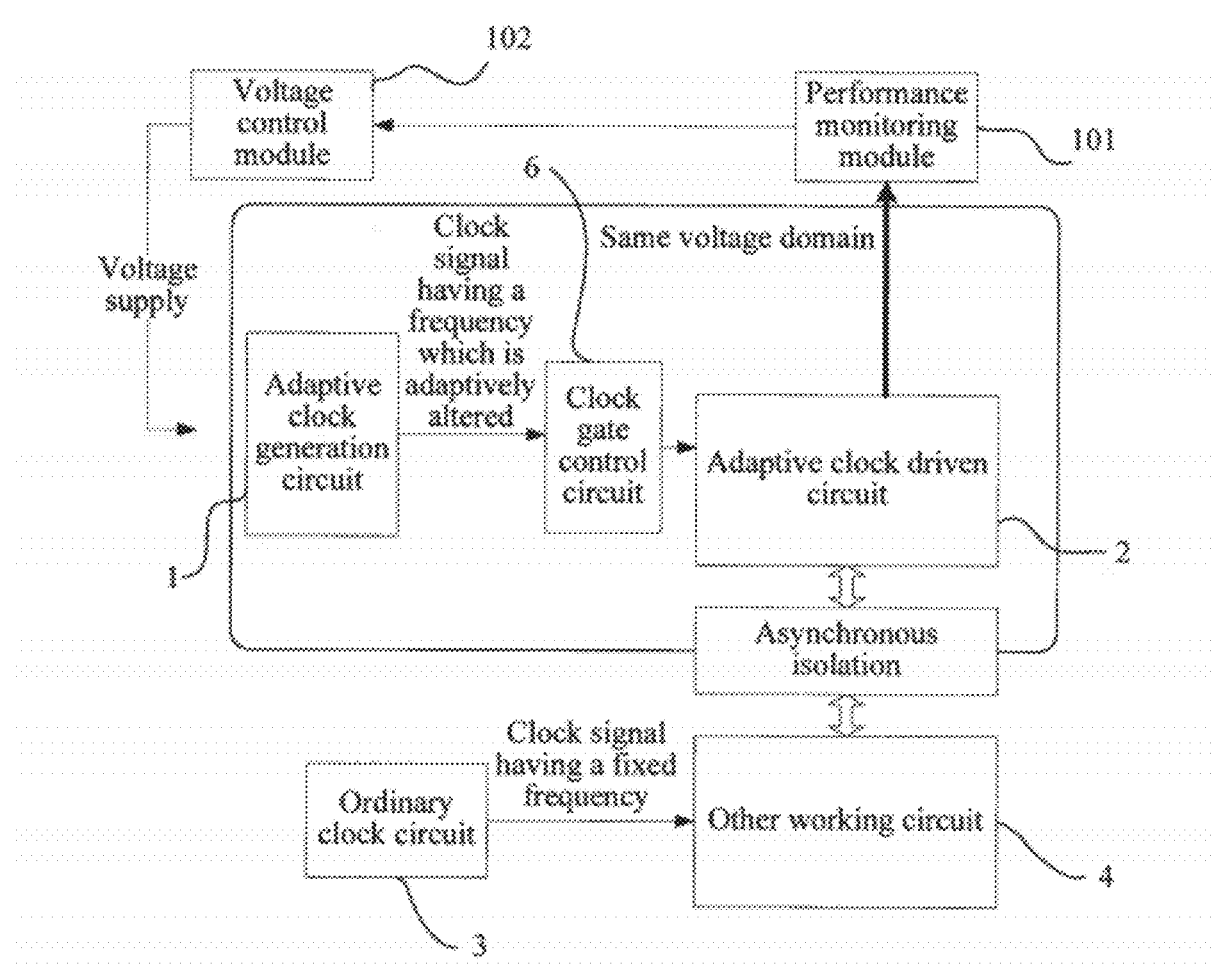
FIG. 10 is a schematic diagram of another logical structure of a clock circuit according to an embodiment of the present invention.

Moreover, as an improvement of the embodiment, as shown in FIG. 10, the clock circuit according to the embodiment further includes a performance monitoring module 101 and a voltage control module 102, where the performance monitoring module 101, which is connected to the adaptive clock driven circuit 2, is configured to monitor a performance parameter of the adaptive clock driven circuit 2 and instruct, according to the performance parameter, the voltage control module 102 to adjust a working voltage, so as to indirectly adjust a working frequency of the circuit and make the frequency of the signal which is output by the adaptive clock generation circuit 1 be adaptively changed according to a change of the working voltage. Under the action of the above two modules, the performance of the circuit may be fully adjusted and power consumption of the adaptive clock driven circuit 2 can be effectively reduced.

Specifically, a case that the adaptive clock driven circuit 2 is a CPU is taken for example, and assuming a CPU occupancy rate of a current task is low, merely 20%, in this case, a working voltage and a working frequency of the CPU may be decreased to complete the same task with lower power consumption. The performance monitoring module 101 is capable of monitoring the CPU occupancy rate. When the CPU occupancy rate is too low, a signal is sent to request the voltage control module 102 to turn down the working voltage; after the working voltage is turned down, the adaptive clock generation circuit 1 automatically decreases the frequency to make the CPU occupancy rate be increased, and the process is repeated till the CPU occupancy rate satisfies a requirement and the power consumption of the adaptive clock driven circuit 2 is most optimized.

When the adaptive clock driven circuit 2 is a CPU, a parameter which may be monitored is the CPU occupancy rate or the number of dummy instructions. When the adaptive clock driven circuit 2 is a GPU, the parameter which may be monitored is the number of drawn triangles or a frame rate of 3D graphics. When the adaptive clock driven circuit 2 is a video codec, the parameter which may be monitored is a frame rate of video encoding and decoding. When the adaptive clock driven circuit 2 is a DSP, the parameter which may be monitored is a completed amount of a specific task within a unit of time. Definitely, if the frequency of the adaptive clock driven circuit 2 is required to be controlled directly, the frequency may also be a parameter to be monitored.

Corresponding to the foregoing method, an embodiment of the present invention further provides a method for providing a clock signal, which includes:

An adaptive clock generation circuit outputs an adaptive clock signal so as to make the adaptive clock driven circuit be driven by the adaptive clock signal to work, where a maximum workable frequency of the adaptive clock driven circuit is higher than or equal to a frequency of the adaptive clock signal.

When a working condition of the adaptive clock driven circuit changes, the maximum workable frequency of the adaptive clock driven circuit changes, the frequency of the adaptive clock signal which is output by the adaptive clock generation circuit changes, and a changing direction of the frequency of the adaptive clock signal is consistent with a changing direction of the maximum workable frequency.

In the method for providing a clock signal according to the embodiment of the present invention, the adaptive clock driven circuit is provided with a clock signal which has a frequency that is adaptively changed along with an alteration of a working condition of the circuit, that is, the adaptive clock driven circuit is capable of working at a frequency which is close to the maximum workable frequency of the circuit at any time. Therefore, the potential of the adaptive clock driven circuit can be fully fulfilled, and a processing speed of the adaptive clock driven circuit can be obviously increased, so that performance of the adaptive clock driven circuit is effectively optimized.

Specifically, the working condition of the adaptive clock driven circuit includes a circuit physical property, a working voltage, and a working temperature of the adaptive clock driven circuit during working. The change of the working condition of the adaptive clock driven circuit include a change of at least one of the circuit physical property, the working voltage and the working temperature of the adaptive clock driven circuit. When at least one of the above three is altered, the maximum workable frequency of adaptive clock driven circuit is accordingly altered, and the frequency of the adaptive clock signal which is output by the adaptive clock generation circuit 1 is also accordingly altered.

Further, when manually or automatically, the working voltage of the adaptive clock driven circuit is altered rapidly and dramatically once, the frequency of the adaptive clock signal and maximum workable frequency both change according to the change of the working voltage of the adaptive clock driven circuit. A frequency change of an output clock signal which is output by the adaptive clock generation circuit and a frequency change of the clock signal which is sensed by the adaptive clock driven circuit are asynchronous, which affects working reliability of the adaptive clock driven circuit. In order to ensure the working reliability of the adaptive clock driven circuit, before the working voltage of the adaptive clock driven circuit is changed, the method for providing a clock signal according to the embodiment of the present invention further includes:

switching the clock signal of the adaptive clock driven circuit to a clock signal having a fixed and safe frequency, or halting the clock signal of the adaptive clock driven circuit;

altering the working voltage of the adaptive clock driven circuit; and after the altered working voltage is stabilized, switching the clock signal of the adaptive clock driven circuit to the adaptive clock signal.

Further, the method for providing a clock signal according to the embodiment of the present invention further includes:

monitoring a performance parameter of the adaptive clock driven circuit; and adjusting, according to the performance parameter, the working voltage of the adaptive clock driven circuit, where the frequency of the adaptive clock signal and the maximum workable frequency both change according to the adjustment of the working voltage.

In this way, by adjusting the working voltage according to the performance parameter, the working frequency of the adaptive clock driven circuit is adjusted indirectly, the power consumption of the adaptive clock driven circuit is effectively reduced, and the performance of the adaptive clock driven circuit is optimized.

The above is only the specific implementation of the present invention, but the protection scope of the present invention is not limited thereto. Any change or replacement that can be easily figured out by persons skilled in the art within the technical scope disclosed by the present invention shall fall within the protection scope of the present invention. Therefore, the protection scope of the present invention shall be subject to the protection scope of the claims.

What is claimed is:
1. A clock circuit, comprising:
an adaptive clock generation circuit, configured to output an adaptive clock signal; and
an adaptive clock driven circuit, configured to be driven by the adaptive clock signal to work, wherein a maximum workable frequency of the adaptive clock driven circuit is higher than or equal to a frequency of the adaptive clock signal,
wherein when a working condition of the adaptive clock driven circuit is changed, the maximum workable frequency of the adaptive clock driven circuit is changed, the frequency of the adaptive clock signal which is output by the adaptive clock generation circuit is changed, and a changing direction of the frequency of the adaptive clock signal is consistent with a changing direction of the maximum workable frequency, and the change of the working condition of the adaptive clock driven circuit comprises a change of a circuit physical property.

2. The clock circuit according to claim 1, wherein the change of the working condition of the adaptive clock driven circuit further comprises a change of at least one of a working voltage and a working temperature of the adaptive clock driven circuit.

3. The clock circuit according to claim 1, wherein a physical location of the adaptive clock generation circuit and that of the adaptive clock driven circuit are close to each other, and belong to a same voltage domain.

4. The clock circuit according to claim 1, wherein the adaptive clock generation circuit and the adaptive clock driven circuit are formed by basic units which belong to a same basic unit library.

5. The clock circuit according to claim 4, wherein
the adaptive clock driven circuit and the adaptive clock generation circuit are respectively formed by logic gates which belong to the same basic unit library; and
the adaptive clock generation circuit is a ring resonator circuit which is formed by a logic gate, and uses self-excited oscillation to output the adaptive clock signal.

6. The clock circuit according to claim 5, wherein the ring resonator circuit of the adaptive clock generation circuit further comprises a delay adjustment circuit, and the adaptive clock signal, after being delayed by the delay adjustment circuit, is output to the adaptive clock driven circuit.

7. The clock circuit according to claim 6, wherein the delay adjustment circuit is formed by cascading n levels of delay units, n is an integer which is larger than 0, and the delay adjustment circuit obtains, by controlling the number of the levels of the delay units which are passed by the clock signal, different delay durations.

8. The clock circuit according to claim 7, wherein
the n levels of the delay units comprise n levels of logic-gate circuits, wherein each level of logic-gate circuit has a control end, an input end and an output end disposed; and
the delay adjustment circuit adjusts, by configuring an input of the control end, the number of levels of logic-gate circuits which are passed by the clock signal to obtain different delay durations.

9. The clock circuit according to claim 6, wherein the delay adjustment circuit comprises a multiplexing selector, and the multiplexing selector comprises a control end and two input ends; and
the two input ends of the multiplexing selector are respectively connected to two delay units which have different delays, and the delay adjustment circuit selects, by configuring an input of the control end of the multiplexing selector, the delay units which are passed by the clock signal to obtain different delay durations.

10. The clock circuit according to claim 1, further comprising a clock control circuit, configured to: before a working voltage of the adaptive clock driven circuit is altered, switch a clock signal of the adaptive clock driven circuit to a clock signal having a fixed and safe frequency, or halt the clock signal of the adaptive clock driven circuit; and after an altered working voltage of the adaptive clock driven circuit is stabilized, switch the clock signal of the adaptive clock driven circuit to a clock signal which is provided by the adaptive clock generation circuit.

11. The clock signal according to claim 1, further comprising a performance monitoring module and a voltage control module, wherein the performance monitoring module is configured to monitor a performance parameter of the adaptive clock driven circuit, and instruct, according to the performance parameter, the voltage control module to adjust a working voltage so as to make the frequency of the clock signal which is output by the adaptive clock generation circuit be adaptively changed according to the change of the working voltage.

12. The clock circuit according to claim 1, wherein the adaptive clock driven circuit comprises a central processing unit, a graphics processing unit, a digital signal processor, an encoding circuit, a decoding circuit, or a hardware accelerator.

13. A method for providing a clock signal, comprising:
outputting, by an adaptive clock generation circuit, an adaptive clock signal so as to make an adaptive clock driven circuit be driven by the adaptive clock signal to work, wherein a maximum workable frequency of the adaptive clock driven circuit is higher than or equal to a frequency of the adaptive clock signal;
wherein when a working condition of the adaptive clock driven circuit is changed, the maximum workable frequency of the adaptive clock driven circuit is changed, the frequency of the adaptive clock signal which is output by the adaptive clock generation circuit is changed, and a changing direction of the frequency of the adaptive clock signal is consistent with a changing direction of the maximum workable frequency, and
the change of the working condition of the adaptive clock driven circuit comprises a change of a circuit physical property.

14. The method for providing a clock signal according to claim 13, wherein
the change of the working condition of the adaptive clock driven circuit further comprises a change of at least one of a working voltage and a working temperature of the adaptive clock driven circuit.

15. The method for providing a clock signal according to claim 13, wherein
when the working voltage of the adaptive clock driven circuit is changed, the frequency of an adaptive clock signal and the maximum workable frequency both change according to the change of the working voltage of the adaptive clock driven circuit;
before the working voltage of the adaptive clock driven circuit is changed, the method further comprise:
switching a clock signal of the adaptive clock driven circuit to a clock signal having a fixed and safe frequency, or halting the clock signal of the adaptive clock driven circuit; and
altering the working voltage of the adaptive clock driven circuit; and
after the altered working voltage is stabilized, switching the clock signal of the adaptive clock driven circuit to the adaptive clock signal.

16. The method for providing a clock signal according to claim 13, wherein the method further comprises:
monitoring a performance parameter of the adaptive clock driven circuit; and
adjusting, according to the performance parameter, the working voltage of the adaptive clock driven circuit, wherein the frequency of the adaptive clock signal and the maximum workable frequency both change according to the adjustment of the working voltage.

* * * * *